United States Patent

Bellorado et al.

(10) Patent No.: US 9,378,097 B1
(45) Date of Patent: Jun. 28, 2016

(54) SELECTIVE COPY-BACK

(71) Applicant: SK hynix memory solutions inc., San Jose, CA (US)

(72) Inventors: Jason Bellorado, San Jose, CA (US); Marcus Marrow, San Jose, CA (US)

(73) Assignee: SK Hynix Memory Solutions Inc., San Jose, CA (US)

( * ) Notice: Subject to any disclaimer, the term of this patent is extended or adjusted under 35 U.S.C. 154(b) by 128 days.

(21) Appl. No.: 14/249,271

(22) Filed: Apr. 9, 2014

Related U.S. Application Data

(60) Provisional application No. 61/870,379, filed on Aug. 27, 2013.

(51) Int. Cl.
*G06F 11/14* (2006.01)
*G06F 11/10* (2006.01)
*G06F 11/07* (2006.01)

(52) U.S. Cl.
CPC .......... *G06F 11/1451* (2013.01); *G06F 11/076* (2013.01); *G06F 11/102* (2013.01)

(58) Field of Classification Search
CPC . G06F 11/1451; G06F 11/102; G06F 11/076; G06F 11/1068; G06F 11/1072; G11C 11/5628; G11C 16/0483; G11C 16/105; G11C 29/52

USPC .......................................................... 714/763
See application file for complete search history.

(56) References Cited

U.S. PATENT DOCUMENTS

| | | | | |
|---|---|---|---|---|
| 2006/0279989 | A1* | 12/2006 | Seong | G11C 11/5628 365/185.03 |
| 2008/0109592 | A1* | 5/2008 | Karamcheti | G06F 9/5016 711/103 |
| 2011/0085379 | A1* | 4/2011 | Kim | G11C 11/5628 365/185.03 |
| 2012/0110250 | A1* | 5/2012 | Sabbag | G06F 11/1072 711/103 |
| 2013/0055047 | A1* | 2/2013 | Sharon | G11C 29/52 714/764 |
| 2013/0159815 | A1* | 6/2013 | Jung | G06F 11/10 714/773 |

* cited by examiner

*Primary Examiner* — James C Kerveros
(74) *Attorney, Agent, or Firm* — IP & T Group LLP

(57) ABSTRACT

Information associated with a neighborhood is obtained based at least in part on a source location. It is determined, based at least in part on the information associated with the determined neighborhood, whether to perform a copy back operation using a specified set of one or more read thresholds. In the event it is determined to perform the copy back operation using the specified set of read thresholds, the copy back operation is performed on the source location using the specified set of read thresholds.

23 Claims, 10 Drawing Sheets

← 800

|  | Member Data Segments | Current Set | Highest # Bit Errors | C/UC ? | Test Set |
|---|---|---|---|---|---|
| SLC Buffer Neighborhood | 1 - N | SLC₁ | - | - | - |
| TLC Neighborhood | (N+1) - 2N | TLC₁ | - | - | - |

Neighborhood Table after Initialization

← 802

| Set Identifier | Threshold A | Threshold B | ... | Threshold F | Threshold G |
|---|---|---|---|---|---|
| TLC₁ | 0.625V | 1.25V | ... | 3.75V | 4.375V |
| TLC₂ | 0.5V | 1V | ... | 3.5V | 4V |

TLC Read Threshold Table

← 804

| Set Identifier | Threshold |
|---|---|
| SLC₁ | 2.5V |
| SLC₂ | 2V |

SLC Read Threshold Table

FIG. 8

| | ... | Current Set | Highest # Bit Errors | C/UC? | Test Set |
|---|---|---|---|---|---|
| SLC Buffer NBHD | ... | $SLC_1$ | 10 | C | $SLC_1$ |
| TLC NBHD | ... | $TLC_1$ | 5 | C | $TLC_1$ |

⬇ — 900

| | ... | Current Set | Highest # Bit Errors | C/UC? | Test Set |
|---|---|---|---|---|---|
| SLC Buffer NBHD | ... | $SLC_1$ | (150) | C | $SLC_1$ |
| TLC NBHD | ... | $TLC_1$ | 20 | C | $TLC_1$ |

⬇ — 902

| | ... | Current Set | Highest # Bit Errors | C/UC? | Test Set |
|---|---|---|---|---|---|
| SLC Buffer NBHD | ... | ($SLC_2$) | ~~150~~ | ~~C~~ | ($SLC_1$) |
| TLC NBHD | ... | $TLC_1$ | 20 | C | $TLC_1$ |

⬇ — 904

| | ... | Current Set | Highest # Bit Errors | C/UC? | Test Set |
|---|---|---|---|---|---|
| SLC Buffer NBHD | ... | $SLC_2$ | (20) | (C) | ($SLC_2$) |
| TLC NBHD | ... | $TLC_1$ | 20 | C | $TLC_1$ |

SELECTIVE COPY-BACK

CROSS REFERENCE TO OTHER APPLICATIONS

This application claims priority to U.S. Provisional Patent Application No. 61/870,379 entitled SELECTIVE COPY-BACK filed Aug. 27, 2013 which is incorporated herein by reference for all purposes.

BACKGROUND OF THE INVENTION

As NAND Flash storage becomes more popular, some issues relating to management of NAND Flash which were not relevant to hard disk drive (HDD) systems (e.g., because of intrinsic differences between NAND Flash memory and HDD) are becoming apparent. New management techniques run periodically throughout the lifetime of the NAND Flash system, which improve performance and/or the lifetime.

BRIEF DESCRIPTION OF THE DRAWINGS

Various embodiments of the invention are disclosed in the following detailed description and the accompanying drawings.

FIG. 8 is a diagram illustrating an embodiment of a neighborhood table after initialization and read threshold tables.

FIG. 9 is a diagram illustrating updates to a neighborhood table.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
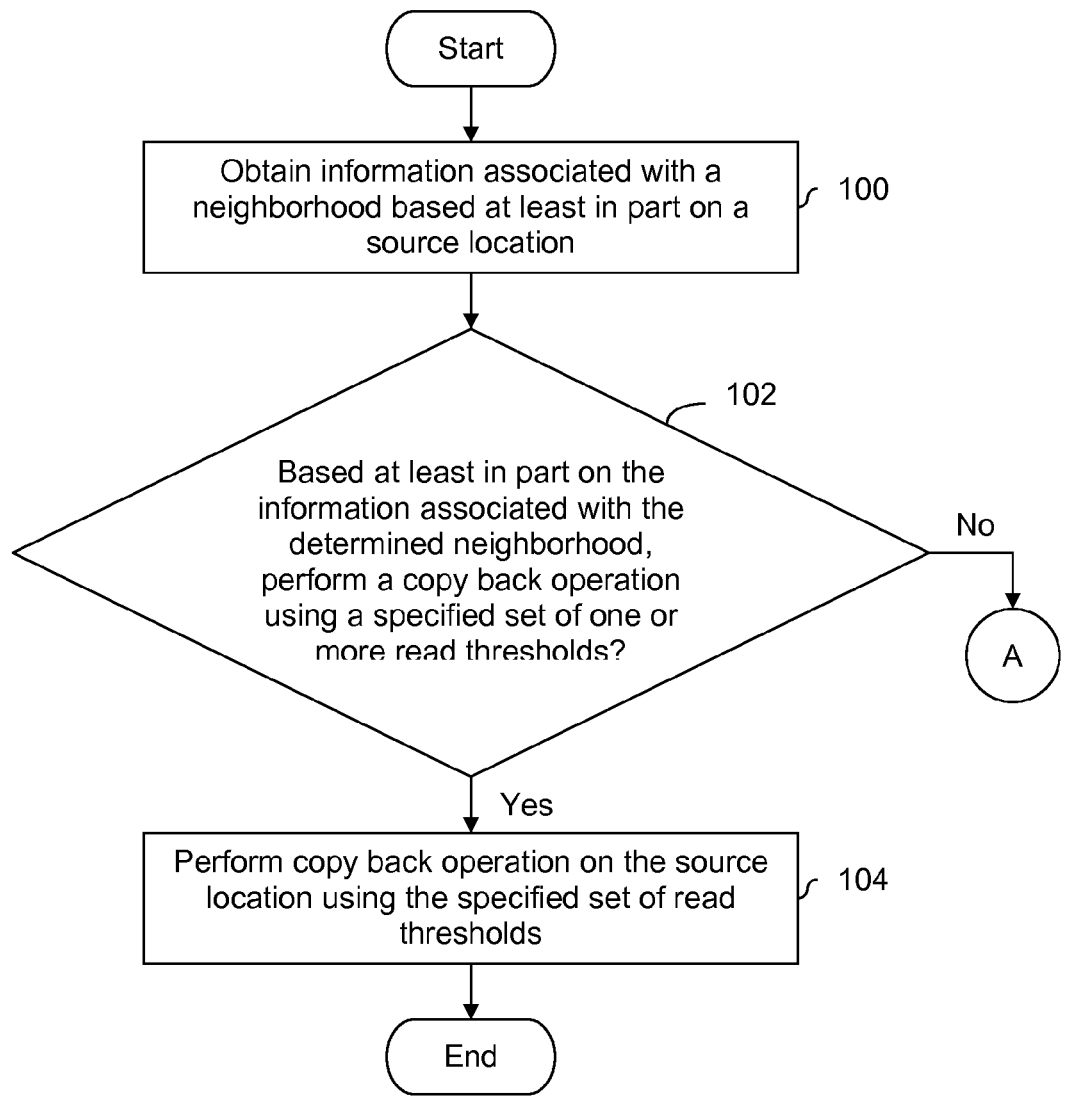
FIG. 1 is a flowchart illustrating an embodiment of a process for performing a selective copy back.

FIG. 1 is a flowchart illustrating an embodiment of a process for performing a selective copy back. In the example shown, the process is performed by a storage controller, such as a NAND controller which writes to and reads from NAND Flash storage.

At 100, information associated with a neighborhood is obtained based at least in part on a source location. In one example, the source location is a target of garbage collection. Unlike some other types of storage (e.g., HDD systems), NAND Flash does not support in-place write operations. As such, parts of a data segment that contain obsolete or out-of-date data are marked as invalid (e.g., since those invalid locations cannot be written to because in-place write operations are not supported). At some point, the NAND controller decides to read the remaining valid data from the target data segment and copy it to a new NAND data segment in order to reclaim the target data segment for reuse. This operation is referred to as garbage collection.

In another example, the source location is associated with a buffer where information is stored temporarily before being written to some final destination in the NAND Flash storage. For example, the NAND Flash storage may be divided into a single level cell (SLC) portion and a triple level cell (TLC) portion. In the SLC portion, cells store a single bit, which corresponds to two voltage levels. In the TLC portion, cells store three bits, which corresponds to eight voltage levels. The SLC portion is used as a buffer where write data is stored temporarily before being written to a more permanent destination in the TLC portion. In some embodiments, the source location is a data segment in the SLC buffer.

In one example of step 100, a neighborhood associated with the source location is first determined by accessing a neighborhood table. Using the source location, the neighborhood is looked up. Then, with the neighborhood known, relevant information associated with that neighborhood is obtained. In some embodiments, neighborhoods are defined or created so that all locations associated with a given neighborhood return a similar number of read errors when read using the same or similar read thresholds. To put it another way, ideally, all locations in a neighborhood will respond similarly (e.g., by returning a similar number of read errors) when read using the same set of read thresholds.

In some embodiments, the information obtained at step 100 includes a number of bit errors associated with a neighborhood, whether a data segment within a neighborhood was uncorrectable, and/or if a maximum number of read thresholds associated with a copy back operation has been reached.

At 102, it is determined, based at least in part on the information associated with the determined neighborhood, whether to perform a copy back operation using a specified set of one or more read thresholds. In one example, the source location comprises SLC NAND Flash where a single read threshold is used to read the source location. In such embodiments, the specified set of read thresholds comprises a single read threshold. If the source location comprises NAND Flash which stores two or more bits (e.g., multi level cell (MLC) which stores 2 bits, TLC which stores 3 bits, and so on), then the specified set of read thresholds comprises two or more read thresholds.

In some NAND Flash systems which support copy back, the copy back operation can only be performed using a fixed set of read threshold(s) which cannot be changed. In such systems, the specified set of read thresholds (e.g., associated with the decision at step 102) comprise the fixed read threshold(s). In some other systems, the set of read thresholds used during copy back can be adjusted and the specified set of read thresholds is merely the current set of read thresholds for the copy back.

In the event is determined to perform a copy back operation with the specified set of read thresholds, a copy back operation is performed on the source location using the specified set of read thresholds at 104. A more detailed example of this is described in further detail below.

Figure 2:
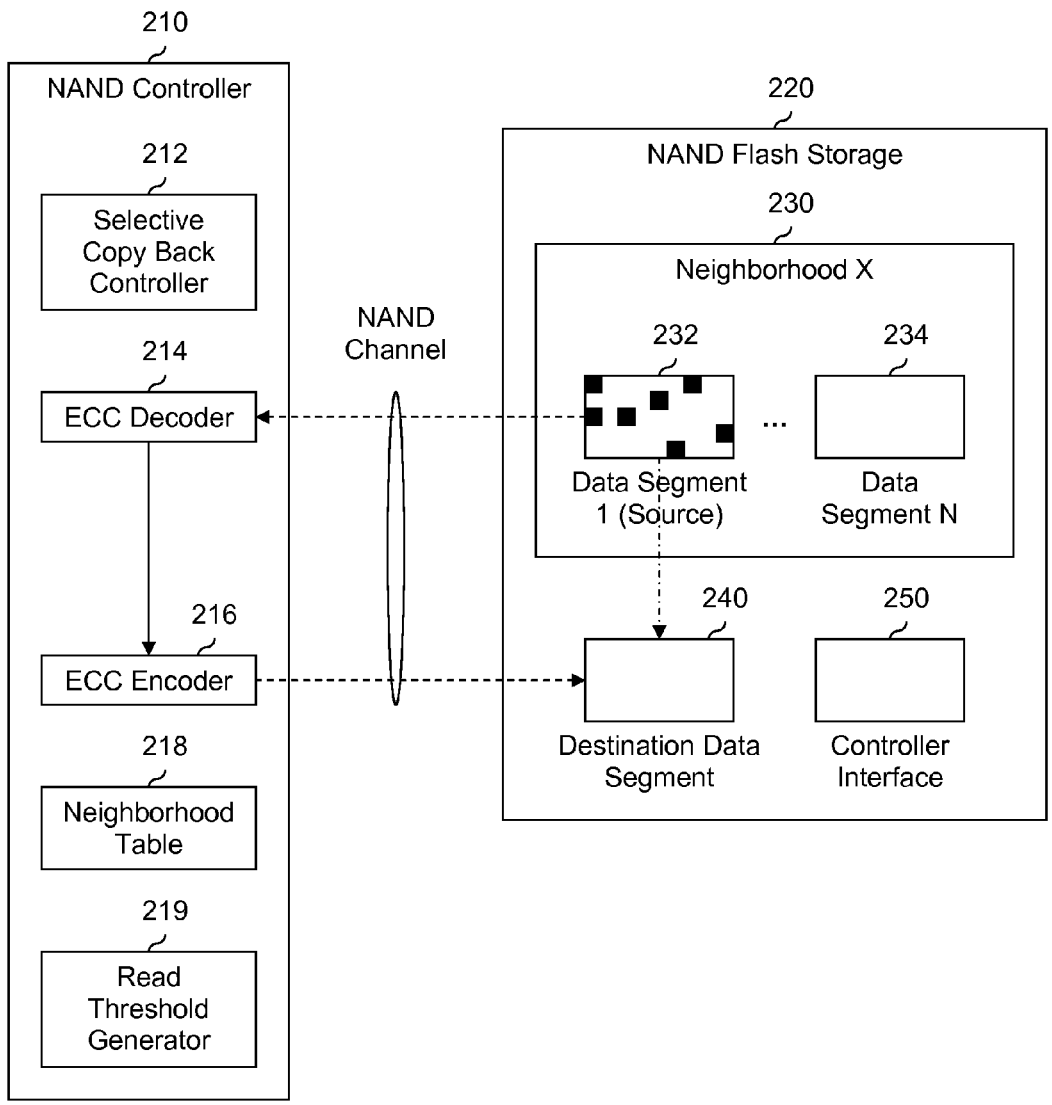
FIG. 2 is a diagram illustrating an embodiment of a NAND Flash storage system which performs selective copy back during garbage collection.

FIG. 2 is a diagram illustrating an embodiment of a NAND Flash storage system which performs selective copy back during garbage collection. In some embodiments, some or all of the components described herein are implemented on or as a semiconductor device, such as an application-specific integrated circuit (ASIC) or a field-programmable gate array (FPGA). NAND controller 210 shows an example of a system which performs the process of FIG. 1. The example described below is associated with a garbage collection process. Other figures will describe a buffering process where write data is buffered (e.g., temporarily) on an SLC buffer on NAND Flash storage before being written (e.g., more permanently) to a TLC portion of the NAND Flash storage.

As described above, NAND Flash storage 220 does not support in-place write operations. Data segments, such as data segment 232, gradually accumulate obsolete or out-of-date data in them over time which are flagged or marked as invalid; valid data is shown in black. In order for data segment 232 to be reclaimed and used to store other data, the data in data segment 232 (at the very least, the valid data) needs to be moved to another data segment, such as destination data segment 240.

There are two options for performing garbage collection on source data segment 232: either read the data back to NAND controller 210 for error correction decoding and re-encoding before writing the re-encoded data to destination data segment 240, or perform a copy back operation so that the stored data is not returned to NAND controller 210.

In this example, selective copy back controller 212 first determines a neighborhood associated with source data segment 232. (Alternatively, the neighborhood may be predetermined.) To do this, selective copy back controller 212 accesses neighborhood table 218 which stores which data segments in NAND Flash storage 220 are members of which neighborhood. In this example, source data segment 232 is a member of neighborhood 230, which includes N data segments. Although this figure only shows a single neighborhood, NAND Flash storage 220 includes any number of neighborhoods.

In this technique, data segments are grouped into neighborhoods so that all members of a given neighborhood are expected to have generally the same program/erase (P/E) wear and/or were fabricated near each other on the same piece of silicon, all of which results in approximately the same retention performance (e.g., how "lossy" a data segment is). To put it another way, all data segments in neighborhood 230 are expected to return roughly the same number of read errors when read with the same read threshold(s). "Good" read threshold(s) are therefore expected be good for all data segments in neighborhood 230.

In one example, neighborhood 230 corresponds to a superblock because data segments in a superblock tend to wear out at the same rate and so each superblock comprises a neighborhood. In another example, NAND Flash storage 220 comprises dual-plane NAND Flash storage. In some dual-plane embodiments, a neighborhood is defined to be all pages within pair-plane blocks. These are merely some examples and are not intended to be limiting.

To continue this example, once the neighborhood is determined, selective copy back controller 212 obtains information associated with the determined neighborhood which is relevant to the decision about whether to perform a copy back operation using the specified set of read thresholds. In this example, selective copy back controller 212 makes the decision based on a number of bit errors associated with neighborhood 230 and whether a data segment in neighborhood 230 is uncorrectable, both of which are stored in neighborhood table 218. Note that the step of determining the neighborhood is not strictly necessary and selective copy back controller 212 may directly obtain the information used in the decision making based on the source location (e.g., without performing the intermediate step of determining the neighborhood).

The following figure shows an example of obtaining information associated with a neighborhood based at least in part on a source location.

Figure 3:
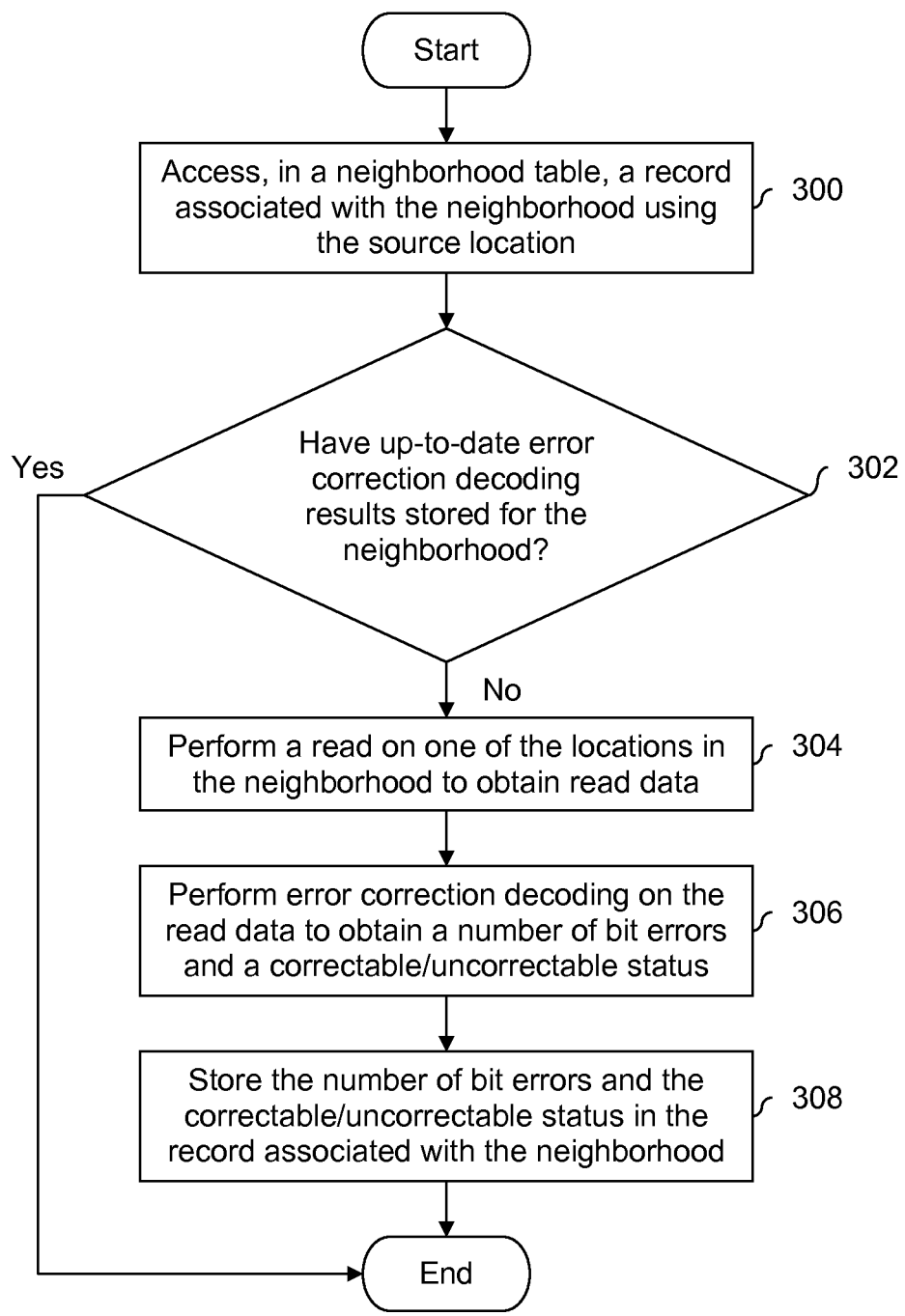
FIG. 3 is a flowchart illustrating an embodiment of a process for obtaining information associated with a neighborhood based at least in part on a source location.

FIG. 3 is a flowchart illustrating an embodiment of a process for obtaining information associated with a neighborhood based at least in part on a source location. In some embodiments, step 100 in FIG. 1 is performed using the following process. In some embodiments, FIG. 3 is performed by selective copy back controller 212 in FIG. 2. In the example shown, if needed, information associated with neighborhood is gathered and stored in the neighborhood table if it is not already stored there.

At 300, within a neighborhood table, a record associated with the neighborhood and is accessed using the source location. For example, all of the records in neighborhood map 218 may be searched using the source location in order to locate the record which contains the source location.

At 302, it is determined if there are up-to-date error correction decoding results stored for the neighborhood. For example, if the relevant record in neighborhood table 218 in FIG. 2 does not have any decoding results for neighborhood 230, then the decision is No. In some embodiments, it is sufficient to have decoding results for a single data segment in a neighborhood. For example, the decoding results stored in neighborhood table 218 may be for data segment 234 in neighborhood 230 even though the decision about whether to perform a copy back operation is related to data segment 232 in neighborhood 230. Using the decoding results from a single data segment in a neighborhood may be attractive because it keeps the size of a neighborhood table down, mitigates excessive use of the NAND channel, and/or enables a selective copy back controller to begin making decisions earlier.

If there are no decoding results stored, then at 304 a read is performed on one of the locations in the neighborhood to obtain read data. Returning to FIG. 2, the read may be performed on data segment 232 or data segment 234 since both data segments are in neighborhood 230. In some embodiments, if possible, the read performed at step 302 uses the same read thresholds as the specified set of read thresholds associated with steps 102 and 104 in FIG. 1.

At 306, error correction decoding is performed on the read data to obtain a number of bit errors (e.g., if the read data is correctable) and a correctable/uncorrectable status (e.g., because the number of bit errors exceeded the error correction capability of the code). At 308, the number of bit errors and the correctable/uncorrectable status are stored in the record associated the neighborhood.

The following figure describes an example of deciding whether to perform a copy back operation using a specified set of read thresholds.

Figure 4:
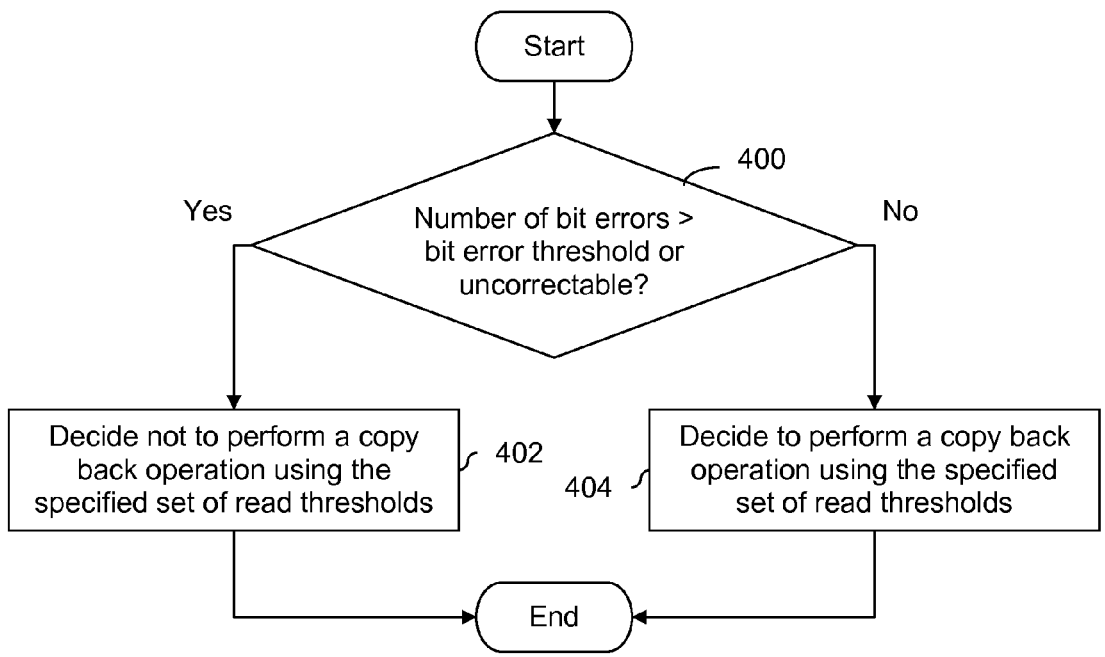
FIG. 4 is a flowchart illustrating an embodiment of a process for deciding whether to perform a copy back operation using a specified set of read thresholds based at least in part on a number of bit errors and a correctable/uncorrectable status.

FIG. 4 is a flowchart illustrating an embodiment of a process for deciding whether to perform a copy back operation using a specified set of read thresholds based at least in part on a number of bit errors and a correctable/uncorrectable status. In some embodiments, FIG. 4 is used at step 102 in FIG. 1. In some embodiments, FIG. 4 is performed by selective copy back controller 212 in FIG. 2.

It is determined at 400 if a number of bit errors exceeds a bit error threshold, or if a correctable/uncorrectable status is set to uncorrectable. If the decision at step 400 is Yes, then it is decided not to perform a copy back operation using the specified set of read thresholds at 402. If the decision at step 400 is No, then it is decided to perform a copy back operation using the specified set of read thresholds at 404.

Returning to FIG. 2, if selective copy back controller 212 decides to perform a copy back operation with the specified set of read thresholds, then a copy back instruction is issued from selective copy back controller 212 to controller interface 250 (e.g., "copy_back <source_data_segment> <destination_data_segment>"). In response to receiving the copy back instruction, controller interface 250 reads source data segment 232 and copies the data to destination data segment 240 without any data leaving NAND Flash storage 220. Note that with the exception of the copy back instruction itself, the NAND channel is not used. This data path is shown with a dashed and dotted line from source data segment 232 to destination data segment 240.

Returning to FIG. 1, the process shown therein does not show what happens if it is decided to not perform a copy back operation at step 102. The following figure shows an example of the subsequent processing down that branch.

Figure 5:
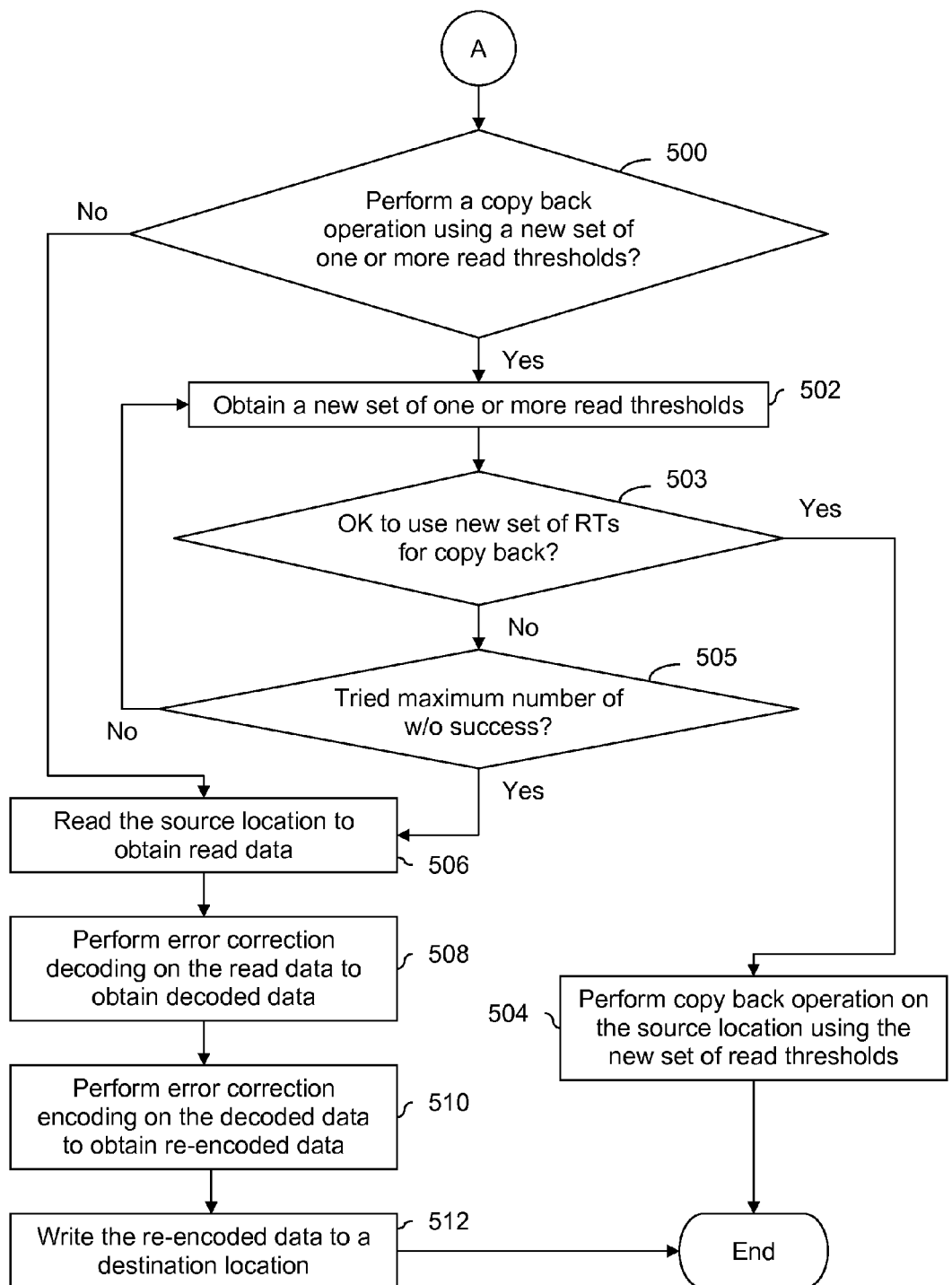
FIG. 5 is a flowchart illustrating an embodiment of processing performed in the event it is decided to not perform a copy back operation using a specified set of read thresholds.

FIG. 5 is a flowchart illustrating an embodiment of processing performed in the event it is decided to not perform a copy back operation using a specified set of read thresholds. In some embodiments, FIG. 5 is performed in the event the decision at step 102 in FIG. 1 is No. In some embodiments, the process is performed by selective copy back controller 212 in FIG. 2.

At 500, it is decided whether to perform a copy back operation using a new set of one or more read thresholds. In one example, the read threshold(s) associated with the copy back operation are fixed and cannot be adjusted. In such systems, the decision at step 500 is No since it is not possible to perform a copy back operation using a new or different set of read thresholds.

In some embodiments, the decision at step 500 is based on the range of an adjustable read threshold. For example, some systems may only permit the read threshold associated with a copy back operation to be set to a certain range (e.g., between $RT_{min}$ and $RT_{max}$). In some embodiments, if the read threshold is already at the lowest setting (i.e., $RT_{min}$), then the decision at step 500 is No since the read threshold cannot be further reduced and the read threshold tends to be adjusted downward over time.

If the decision at 500 is Yes, then at 502 a new set of one or more read thresholds is obtained. In one example of step 502, one or more new or next read thresholds is/are generated by read threshold generator 219 in FIG. 2 and is/are passed to selective copy back controller 212. Read threshold generator 219 is configured to select or otherwise determine one or more read thresholds to attempt next. Any technique for selecting or determining new read threshold(s) may be used. For example, a relatively simple technique may be used where the current read threshold(s) are decreased by some step size (e.g., $\Delta$). In some embodiments, more sophisticated techniques are used to select the next read threshold(s) to use (e.g., based on previous read thresholds, previous read data, previous decoding results, etc.).

At 503, it is determined if it is okay to use the new set of read thresholds for copy back. For example, a process similar to that shown in FIG. 4 may be used at step 503. If the decision at step 503 is Yes, then at 504, a copy back operation is performed on the source location using the new set of read thresholds. In one example of step 504, selective copy back controller 212 in FIG. 2 sends to controller interface 250 a copy back instruction of "copy_back <source_data_segment> <destination_data_segment> <new_read_threshold(s)>". In another example of step 504, selective copy back controller 212 in FIG. 2 programs a register in NAND Flash storage 220 (not shown) associated with a read threshold used during copy back. After programming the register, selective copy back controller 212 issues a copy back instruction of "copy_back <source_data_segment> <destination_data_segment>" to controller interface 250. This data path is represented by the dashed and dotted line between source data segment 232 and destination data segment 250 in FIG. 2.

If the decision at step 503 is No, then it is determined at 505 if a maximum number of new sets of read thresholds has been tried without success (e.g., step 502 has been repeated $N_{max}$ times). If the decision at step 505 is No, then a new set of one or more read thresholds is obtained at step 502.

If the decision at step 500 is No or if the decision at step 505 is Yes, then at 506 the source location is read to obtain read data. In one example of step 506, selective copy back controller 212 in FIG. 2 reads source data segment 232 by issuing a read instruction (e.g., "read <source_data_segment>"). Controller interface 250 receives the read instruction and returns the data from source data segment 232 to error correction code (ECC) decoder 214, which acts to remove the excessive bit errors that exist.

At 508, error correction decoding is performed on the read data to obtain decoded data. In one example of step 508, ECC decoder 214 in FIG. 2 performs error correction decoding on the data read from source data segment 232. If desired, the decoding results from ECC decoder 214 (e.g., a number of bit errors, whether data segment 232 was uncorrectable or not) may be used to update information stored in neighborhood table 218 for future use.

At 510, error correction encoding is performed on the decoded data to obtain re-encoded data. In one example of step 510, ECC encoder 216 in FIG. 2 encodes the decoded data from ECC decoder 214. If desired, any out-of-date or invalid data may be discarded and/or new data may be added before encoding by ECC encoder 216.

At 512, the re-encoded data is written to a destination location. In one example of step 512, selective copy back controller 212 in FIG. 2 issues a write instruction (e.g., "write <destination_data_segment> <encoded_data>") which causes the re-encoded data to be stored in destination data segment 240. This data path coming and going across the NAND channel is shown with dashed lines. In some embodiments, additional or new data is added before encoding (e.g., if invalid data was discarded) so that the output of ECC encoder 216 will occupy all of destination data segment 240.

Returning to FIG. 2, over the lifecycle of the system shown, the following trend will generally be followed. Initially, the quality of NAND Flash storage 220 is good since the number of P/E cycles is relatively low. During this period, relatively few bit errors will occur and most of the read data will be correctable, and so most of the time selective copy back controller 212 will decide to perform copy back using the specified set of read thresholds.

As NAND Flash storage 220 ages and the number of P/E cycles increases, the data segments in NAND Flash storage 220 will return more bit errors when read using the specified (e.g., default or initial) read thresholds associated with the copy back operation and/or more of the read data will be uncorrectable. During this second period, NAND Flash storage 220 has degraded enough where it is undesirable to use the specified read thresholds during a copy back operation. As such, new read thresholds (if supported) are used during the copy back operation. This mitigates usage of the NAND channel but reduces the number of errors returned during a read (i.e., the new read threshold(s) will return fewer read errors than the specified read threshold(s) when the system is in this state).

As time goes on, NAND Flash storage 220 further degrades as the number of P/E cycles further increases. During this third period, it may be that the risk of introducing or copying errors to destination data segment 240 is too great even if the read threshold(s) used during copy back operation are adjusted, and/or the system cannot support even lower read threshold(s). As such, the data stored in the source location is error correction decoded and re-encoded on the NAND controller before being stored in the destination location. Although this requires read data to be sent over the NAND channel and the re-encoded data to be sent back over the NAND channel, the benefit of decoding and re-encoding the data is believed to be worth the cost of occupying the NAND channel.

Note that the periods described above are a generalization and it is not necessary for all neighborhoods to be in the same state at the same time. For example, a neighborhood which has a higher P/E count may be further along the lifecycle (e.g., forced to read data back to the NAND controller, decode, and re-encode) than a neighborhood which has much fewer P/E cycles (e.g., still performing copy back using a default or initial set of read thresholds). Also note that, since the die-to-die SNR variation is significant, it is likely that some neighborhoods will still be able to utilize the copy-back operation to the end of the device's life.

By performing selective copy back, the costs and benefits of error correction decoding and re-encoding can be balanced against the costs and benefits of copy back. A benefit to copy back is that it does not occupy the NAND channel as much. A downside is that if the specified set of read thresholds used during copy back is relatively far from a distribution crossover point, then a relatively large number of read errors may occur and those errors will be written to the destination data segment (resulting in the propagation or introduction of errors). If error correction decoding and re-encoding were performed instead, the costs and benefits are reversed. A benefit to re-encoding is that (read) errors are removed from and/or not introduced into the destination data segment, but it comes at the cost of NAND channel usage and encoder/decoder usage.

In contrast, some other systems which always perform copy back will have errors introduced in the destination data segments, especially as the NAND Flash storage wears out and the (for example) default or initial read thresholds begin to return errors during the read part of the copy back. Likewise, other systems which always perform error correction decoding and re-encoding on the NAND controller will occupy the NAND channel to a greater degree and this may interfere with access and/or turn-around times (e.g., as observed by a host when accessing NAND Flash storage).

It is also noted that using neighborhoods to perform selective copy back permits selective copy back to be performed in a memory efficient manner. Some other systems may decide to perform selective copy back on a data segment-by-data segment basis. This requires storing information for each data segment in a neighborhood table, which is a significant amount of information. Using neighborhoods significantly reduces the amount of information stored, while still providing relatively comparable or "good enough" results.

As described above, in some embodiments, a source location is associated with a buffer in which write data is temporarily stored before being moved to some more permanent location. The following figure shows an example of such a system.

Figure 6:
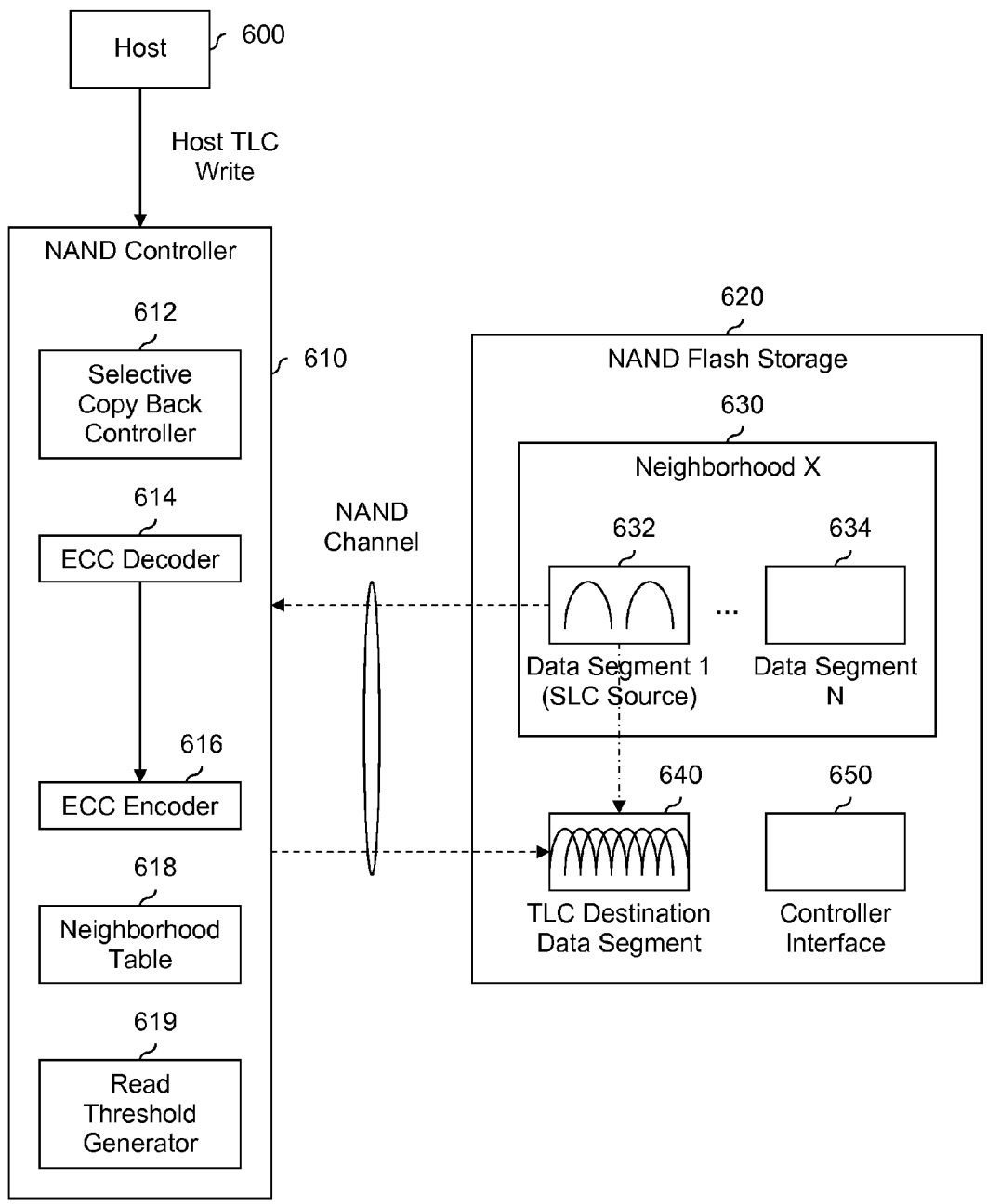
FIG. 6 is a diagram illustrating an embodiment of a NAND Flash storage system which performs selective copy back during a host write to TLC storage.

FIG. 6 is a diagram illustrating an embodiment of a NAND Flash storage system which performs selective copy back during a host write to TLC storage. In the example shown, host 600 issue a host write to TLC storage. The write data is temporarily stored in SLC source data segment 632 which is in neighborhood 630. In this example, all data segments in neighborhood 630 are associated with an SLC buffer which is used to store host write data temporarily before the write data is stored more permanently to TLC storage. At some point, the write data is transferred from SLC source data segment 632 to TLC destination data segment 660 for long term storage (e.g., whenever controller interface 660 is not otherwise occupied with higher priority tasks).

The example processes described above may be used by selective copy back controller 612 when deciding how to move data from SLC source data segment 632 to TLC destination data segment 640. In other words, selective copy back controller 612 may perform the process of FIG. 1, FIG. 3, FIG. 4, and/or FIG. 5. Transfer of the host write data from SLC source data segment 632 to TLC destination data segment 640 may be performed: (1) using a copy back operation which uses the specified set of read thresholds (e.g., the data path shown in a dashed and dotted line), (2) using a copy back operation which uses a new or next set of read thresholds (e.g., also the data path shown in a dashed and dotted line but with a different set of read thresholds), or (3) by reading the data in SLC source data segment 632 back to NAND controller 610 for error correction decoding and re-encoding on NAND controller 610 before being written to TLC destination data segment 640 (e.g., the data path shown with dashed lines).

Figure 7:
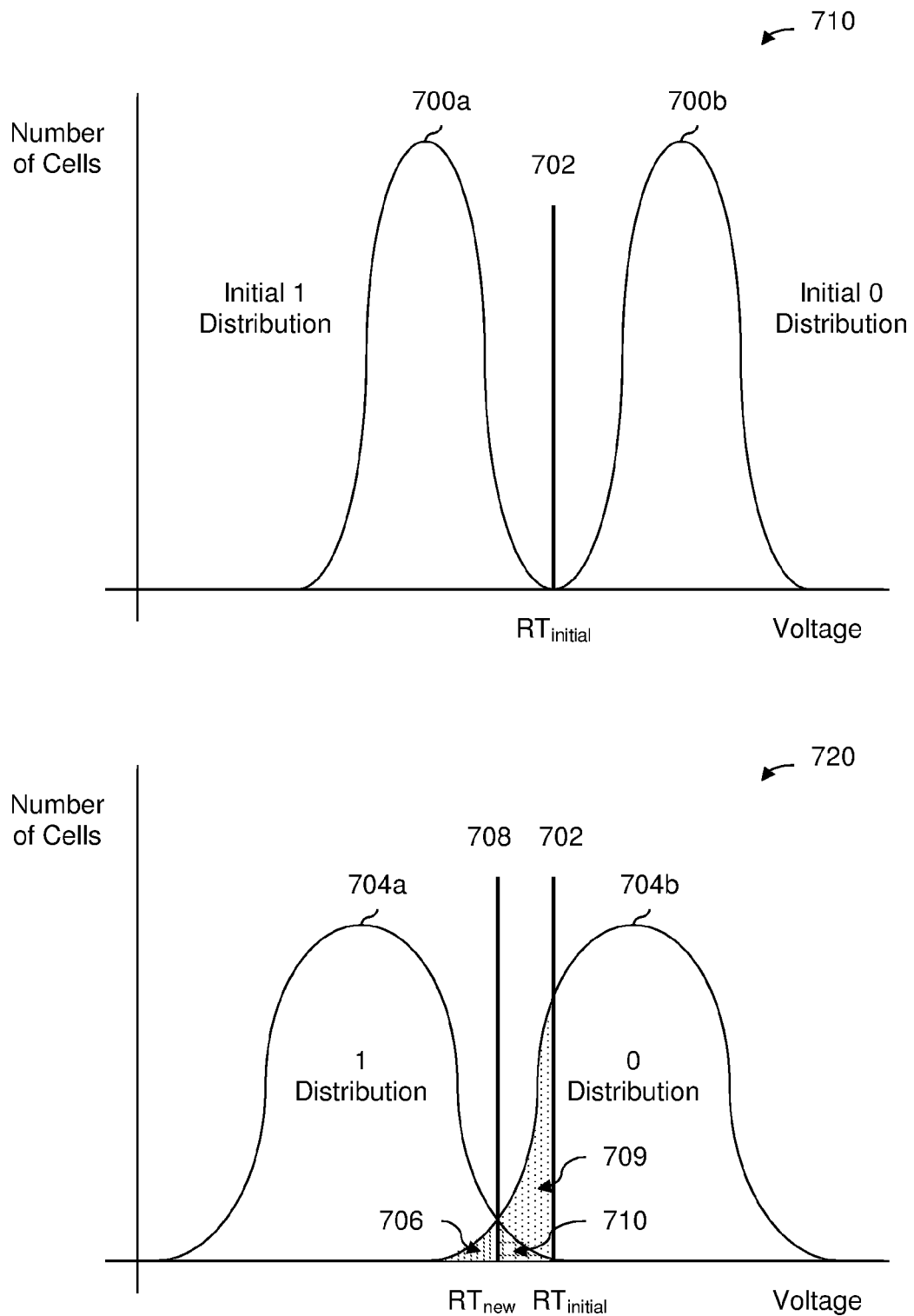
FIG. 7 is a diagram illustrating an embodiment of a new read threshold which is used during a copy back operation.

FIG. 7 is a diagram illustrating an embodiment of a new read threshold which is used during a copy back operation. In the example shown, graph 710 shows initial distributions 700a and 700b which are associated with cells in a source data segment (e.g., source data segment 232 in FIG. 2 or source data segment 632 in FIG. 6). Due to slight differences (e.g., during the programming process and/or because of slight manufacturing differences), two cells which store the same binary value (e.g., a 0 versus a 1) may not store exactly the same voltage. Hence, a stored value of 1 is represented by initial distribution 700a and a stored value of 0 is represented by initial distribution 700b. For simplicity, a SLC example is shown where each cell stores a single bit (i.e., either a 0 or a 1 is stored).

Initial read threshold 702 corresponds to an initial read threshold associated with a copy back operation. (In this example, the read thresholds associated with a copy back operation are able to be adjusted, if desired.) As is shown in diagram 710, initial read threshold 702 is very close to the crossover point of initial distributions 700a and 700b. As such, relatively few bit errors will be written to the destination data segment when initial read threshold 702 is used during a copy back operation.

Diagram 720 shows initial distributions 700a and 700b after the source data segment has been programmed and erased a number of times. The increased P/E count causes initial distributions 700a and 700b to degrade into distributions 704a and 704b, respectively. The centers of the distributions has decreased (e.g., the means of initial distributions 702a and 702b are respectively greater than distributions 704a and 704b) and the "spread" of the distributions has increased (e.g., the standard deviations of distributions 704a and 704b are respectively greater than initial distributions 702a and 702b).

If initial read threshold 702 were used during a copy back operation on distributions 704a and 704b, read errors would be returned. More specifically, the cells which fall into vertically striped region 706, dotted region 709, and grid-patterned region 710 would be incorrectly read as a 1 when in fact they were written with a 0. The number of cells which actually store a 1 but are incorrectly read as a 0 is negligible in this example. These "actually 0, but read as a 1" errors would be introduced into the destination data segment during the copy back operation, which is undesirable.

If new read threshold 708 were instead used during the copy back operation instead of initial read threshold 702, fewer read errors would occur. More specifically, the cells which fall into grid-patterned region 710 actually store a 1 but would be incorrectly read as a 0 and the cells which fall into vertically striped region 706 actually store a 0 but would be incorrectly read as a 1. However, the total number of bits errors is less when new read threshold 708 is used compared to when initial read threshold 702 is used (e.g., the sum of regions 706 plus 710 is less than the sum of regions 706, 709, and 710).

Generally speaking, the number of read errors goes down when the read threshold is closer to the crossover point of the distributions. As such, since new read threshold 708 is closer to the crossover point of distributions 704a and 704b, new read threshold 708 will introduce fewer errors during copy back than initial read threshold 702 when used in conjunction with distributions 704a and 704b. In this example, read thresholds will tend to be adjusted downwards since the distributions will trend downwards. (In some real NAND systems, they can go in either direction.)

FIG. 8 is a diagram illustrating an embodiment of a neighborhood table after initialization and read threshold tables. In the example shown, tables 800, 802, and 804 are associated with the system shown in FIG. 6 where a SLC buffer is used to temporarily store host write data before it is written to a TLC portion of the NAND Flash storage.

In the example shown, neighborhood table 800 includes two records: one for an SLC buffer neighborhood (e.g., neighborhood 630 in FIG. 6) and one for a TLC neighborhood (e.g., the neighborhood which includes TLC destination data segment 640). In neighborhood table, the leftmost field identifies the member data segments which comprise each neighborhood. In this example, the SLC neighborhood includes data segments 1-N and the TLC neighborhood includes data segments (N+1)-2N. The second from left field identifies the current set of one or more read thresholds (e.g.,) which would be used if a copy back operation were performed. The middle field and the second from right field store the highest number of bit errors and the correctable/uncorrectable status information, respectively, for each neighborhood. The rightmost field is used to record the test set of one or more read thresholds, which is the set of read thresholds which was used to obtain the highest number of bit errors and the correctable/uncorrectable status information. Note that sometimes the current set of read thresholds and test set of read threshold will match and sometimes they will not match.

In the state shown, neighborhood table 800 has been initialized so that the member data segments and current set information has been populated for the SLC neighborhood record and TLC neighborhood record, but the other fields are blank. For example, $SLC_1$ and $TLC_1$ may be default or initial sets of read thresholds that the system begins with.

TLC read threshold table 802 and SLC read threshold table 804 are used to store the various TLC and SLC read threshold values, respectively. In TLC read threshold table 802, there are two records: one for $TLC_1$ and one for $TLC_2$. When reading the TLC portion of storage, 7 read thresholds are involved and so values for all 7 read thresholds are recorded for both $TLC_1$ and for $TLC_2$. For $TLC_1$, those values are: 0.625V, 1.25V, . . . , 3.75V, and 4.375V. For $TLC_2$, those values are: 0.5V, 1V, . . . , 3.5V, and 4V.

In SLC, a single threshold is involved in a read. In read threshold table 804, the voltage level for the single read threshold in $SLC_1$ is 2.5V and the voltage level for the single read threshold in $SLC_2$ is 2V.

FIG. 9 is a diagram illustrating updates to a neighborhood table. FIG. 9 continues the example of FIG. 8 and shows updates which are made to neighborhood table 800.

In diagram 900, the neighborhood table has been updated so that the highest number of bit errors and correctable/uncorrectable status information has been populated. In some embodiments, the process of FIG. 3 is used to populate those fields. For example, a selective copy back controller needs to make a decision and the necessary information is not available in the neighborhood table. This triggers a "sampling" of a data segment from the neighborhood associated with the source location. In some embodiments, a neighborhood table is populated organically. For example, as host read instructions come in from the host, the decoding results are stored (if appropriate) in the neighborhood table for future use.

In diagram 902, the highest number of bit errors for the SLC neighborhood has increased from 10 to 150. If the bit error threshold is 100, then the stored highest number of bit errors of 150 will cause the system to perform a copy back operation with a new set of read thresholds. As such, the current set of read thresholds in the SLC neighborhood record is updated from SLC1 to SLC2. As shown in FIG. 8, this corresponds to changing the read threshold used during copy back from 2.5V to 2V.

With the current set of read thresholds in the SLC neighborhood record changed from $SLC_1$ to $SLC_2$ in diagram 904, the current set of read thresholds does not match the test set of read thresholds in the SLC neighborhood record. This means that the decoding results stored in the SLC neighborhood record (i.e., highest number of bit errors=150 and correctable/uncorrectable status=correctable) are out-of-date and cannot be used to make a copy back decision.

Diagram 906 shows the neighborhood table with up-to-date decoding results for the SLC neighborhood record. In various embodiments, this update can occur in a passive manner (e.g., waiting for a host read to come along that hits the SLC neighborhood) or in an active manner (e.g., triggering a read of the SLC neighborhood, where there is no corresponding host read). As shown in diagram 906, the second set of SLC read thresholds was used to obtain the decoding results, and the highest number of bit errors has gone down from 150 (with $SLC_1$) to 20 (with $SLC_2$). The correctable/uncorrectable status remains correctable when going from $SLC_1$ to $SLC_2$.

Note that the data segments used to update the neighborhood table do not have to be the same or otherwise consistent. So long as a data segment is associated with a neighborhood, it is eligible to be used to update the corresponding record.

Figure 10:
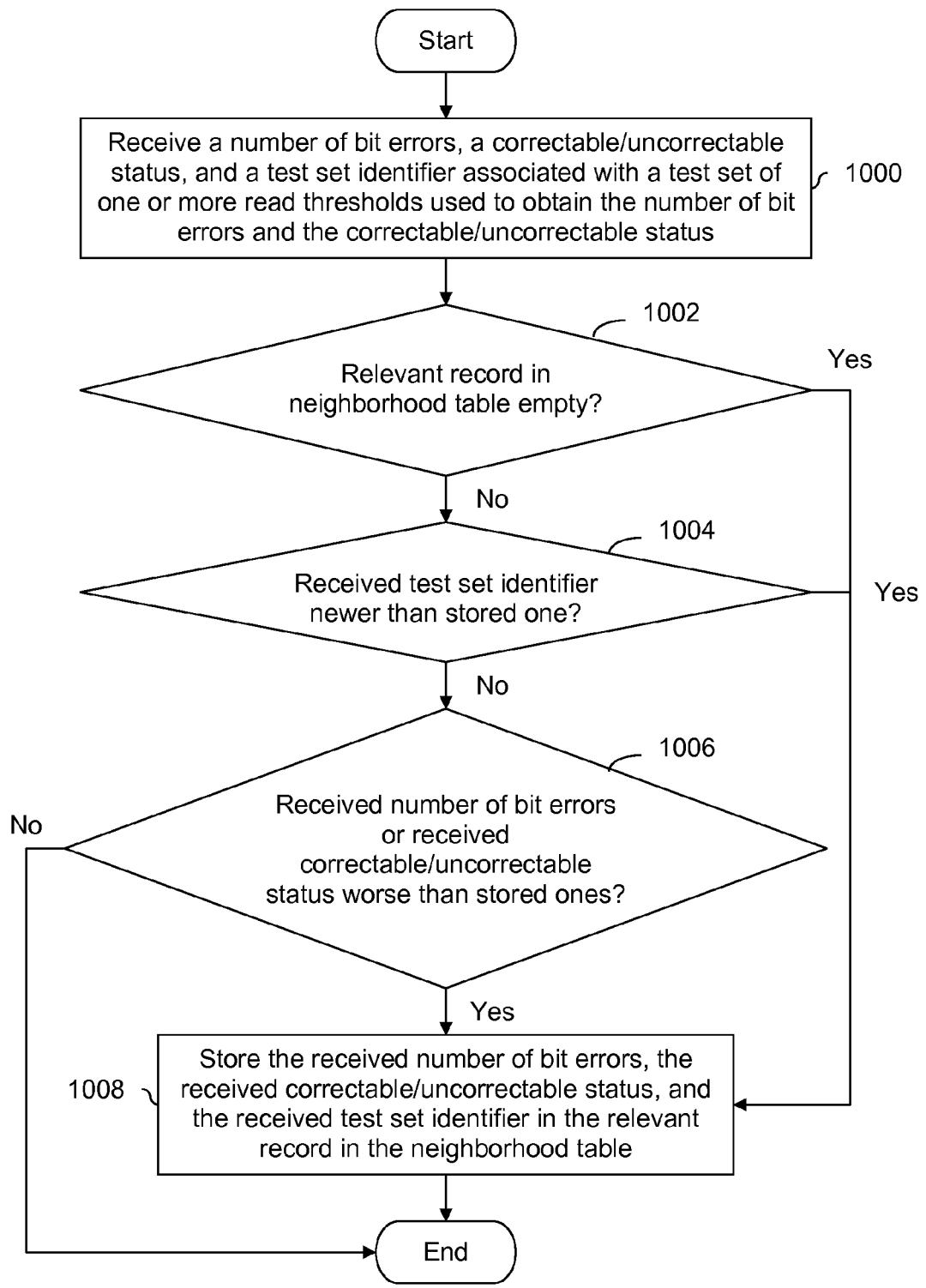
FIG. 10 is a flowchart illustrating an embodiment of a process for updating a neighborhood table.

FIG. 10 is a flowchart illustrating an embodiment of a process for updating a neighborhood table. In some embodiments, the process is used to organically or passively update a neighborhood table. In some embodiments, the process is performed by neighborhood table 218 in FIG. 2 or neighborhood table 618 in FIG. 6 to decide what information to store within itself and what information to discard.

At 1000, a number of bit errors, a correctable/uncorrectable status, and a test set identifier associated with a test set of one or more read thresholds used to obtain the number of bit errors and the correctable/uncorrectable status are received. In some embodiments, the information is received in response to a host read instruction. In some embodiments, the information is received in response to a NAND storage controller-initiated read (e.g., for some management or background processing that the host is unaware of).

At 1002, it is determined if the relevant record in a neighborhood table is empty. For example, the neighborhood table in diagram 800 in FIG. 8 would be considered empty, but the neighborhood table in diagram 900 in FIG. 9 would not be considered empty. If it is determined that the relevant record is empty at step 1002, the received number of bit errors, the received correctable/uncorrectable status, and the received test set identifier are stored in the relevant record in the neighborhood table at 1008.

If it is determined that the relevant record is not empty at step 1002, it is determined at step 1004 if the received test set identifier is newer than a stored one. If so, the received information is stored at step 1008. For example, between diagrams 904 and 906 in FIG. 9, some decoding results are received which were obtained using $SLC_2$. Since the stored test set identifier in diagram 904 is $SLC_1$ and the received test set identifier is $SLC_2$, the decision at step 1004 is Yes. As is shown in diagram 906, the received information is used to update the SLC neighborhood record.

If it is determined that the received test set identifier is the same or older than a stored one, it is determined at step 1006 if the received number of bit errors or received correctable/uncorrectable status is worse than the stored ones. If so, the received information is stored at step 1008. In one example, in diagrams 900 and 902 in FIG. 2 the test set identifiers for the SLC neighborhood record are $SLC_1$. Having 150 bit errors is worse than having 10 bit errors, so the highest number of bit errors is updated from 10 to 150.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for moving data, comprising:
a selective copy back controller configured to:
 obtain information associated with a neighborhood based at least in part on a source location;
 determine, based at least in part on the information associated with the determined neighborhood, whether to perform a copy back operation on the source location by:
  determining whether a number of bit errors is greater than a bit error threshold or if a correctable/uncorrectable status is set to uncorrectable such that:
   when it is determined the number of bit errors is less than the bit error threshold and the correctable/uncorrectable status is set to correctable, the selective copy back controller is configured to perform the copy back operation using a specified read threshold, and
   when it is determined the number of bit errors is greater than the bit error threshold or the correctable/uncorrectable status is set to uncorrectable, the selective copy back controller is configured to obtain a new read threshold and to perform the copy back operation using the new read threshold; and
a neighborhood table configured to store the information associated with the neighborhood.

2. The system of claim 1, wherein the source location is a target of garbage collection.

3. The system of claim 1, wherein the source location is associated with a single level cell (SLC) buffer where host write data is stored temporarily before being stored more permanently in a destination location where cells are configured to store two or more bits.

4. The system of claim 1, further comprising NAND Flash storage, wherein the source location is on the NAND Flash storage.

5. The system of claim 1, wherein the selective copy back controller includes a semiconductor device, including one or more of the following: an application-specific integrated circuit (ASIC) or a field-programmable gate array (FPGA).

6. The system of claim 1, wherein the selective copy back controller is configured to obtain information, including by:
 accessing, in the neighborhood table, a record associated with the neighborhood using the source location;
 determining if there are error correction decoding results stored for the neighborhood in the access record; and
 in the event it is determined that there are no error correction decoding results stored for the neighborhood in the access record:
  performing a read on one of the locations in the neighborhood to obtain read data;
  performing error correction decoding on the read data to obtain a number of bit errors and a correctable/uncorrectable status; and
  storing the number of bit errors and the correctable/uncorrectable status in the record associated with the neighborhood.

7. The system of claim 1, wherein when it is determined to not perform the copy back operation, the selective copy back controller is further configured to:
 determine whether to perform a copy back operation using the new read threshold; and
 when it is determined to perform a copy back operation using the new read threshold:
  determine whether it is okay to use the new read threshold for copy back; and when it is determined that it is okay to use the new read threshold for copy back, perform a copy back operation on the source location using the new read threshold.

8. The system of claim 7, wherein the new read threshold is less than the specified read threshold.

9. The system of claim 7, wherein the selective copy back controller is further configured to, when it is determined to not perform a copy back operation using the new read threshold:
read the source location to obtain read data;
perform error correction decoding on the read data to obtain decoded data;
perform error correction encoding on the decoded data to obtain re-encoded data; and
write the re-encoded data to a destination location.

10. The system of claim 7, wherein when it is determined that it is not okay to use the new read threshold for copy back, the selective copy back controller is further configured to:
determine if a maximum number of new read thresholds has been tried without success;
when it is determined that the maximum number of new read thresholds have been tried without success:
read the source location to obtain read data;
perform error correction decoding on the read data to obtain decoded data;
perform error correction encoding on the decoded data to obtain re-encoded data; and
write the re-encoded data to a destination location are performed; and
in the event it is determined that the maximum number of new read thresholds have not been tried without success, obtain a second new read threshold.

11. The system of claim 1, wherein the neighborhood table is configured to:
receive a number of bit errors, a correctable/uncorrectable status, and a test set identifier associated with a test set of one or more read thresholds used to obtain the number of bit errors and the correctable/uncorrectable status;
determine if a relevant record in the neighborhood table is empty;
in the event it is determined that the relevant record is empty, store the received number of bit errors, the received correctable/uncorrectable status, and the received test set identifier in the relevant record in the neighborhood table; and
in the event it is determined that the relevant record is empty:
determine if the received test set identifier is newer than a stored one;
in the event it is determined that the received test set identifier is newer than the stored one, store the received number of bit errors, the received correctable/uncorrectable status, and the received test set identifier in the relevant record in the neighborhood table; and
in the event it is determined that the received test set identifier is not newer than the stored one:
determine if the received number of bit errors or the received correctable/uncorrectable status is worse than the stored ones; and
in the event it is determined that the received number of bit errors or the received correctable/uncorrectable status is worse than the stored ones, store the received number of bit errors, the received correctable/uncorrectable status, and the received test set identifier in the relevant record in the neighborhood table.

12. A method for moving data, comprising:
obtaining information associated with a neighborhood based at least in part on a source location;
determining, based at least in part on the information associated with the determined neighborhood, whether to perform a copy back operation on the source location by:
determining whether a number of bit errors is greater than a bit error threshold or if a correctable/uncorrectable status is set to uncorrectable such that:
when it is determined the number of bit errors is less than the bit error threshold and the correctable/uncorrectable status is set to correctable, performing, with a processor the copy back operation using a specified read threshold, and
when it is determined the number of bit errors is greater than the bit error threshold or the correctable/uncorrectable status is set to uncorrectable, obtaining, with the processor, a new read threshold and performing, with the processor, the copy back operation using the new read threshold.

13. The method of claim 12, wherein the source location is a target of garbage collection.

14. The method of claim 12, wherein the source location is associated with a single level cell (SLC) buffer where host write data is stored temporarily before being stored more permanently in a destination location where cells are configured to store two or more bits.

15. The method of claim 12, wherein the source location is on NAND Flash storage.

16. The method of claim 12, wherein the processor includes a semiconductor device, including one or more of the following: an application-specific integrated circuit (ASIC) or a field-programmable gate array (FPGA).

17. The method of claim 12, wherein obtaining information includes:
accessing, in a neighborhood table, a record associated with the neighborhood using the source location;
determining if there are error correction decoding results stored for the neighborhood in the access record; and
in the event it is determined that there are no error correction decoding results stored for the neighborhood in the access record:
performing a read on one of the locations in the neighborhood to obtain read data;
performing error correction decoding on the read data to obtain a number of bit errors and a correctable/uncorrectable status; and
storing the number of bit errors and the correctable/uncorrectable status in the record associated with the neighborhood.

18. The method of claim 12, further comprising: when it is determined to not perform the copy back operation:
determining whether to perform a copy back operation using the new read threshold; and
when it is determined to perform a copy back operation using the new read threshold:
determining whether it is okay to use the new read threshold for copy back; and
when it is determined that it is okay to use the new read threshold for copy back, using the processor to perform a copy back operation on the source location using the new read threshold.

19. The method of claim 18, wherein the new read threshold is less than the specified read threshold.

20. The method of claim 18, further comprising: when it is determined to not perform a copy back operation using the new read threshold:
    reading the source location to obtain read data;
    performing error correction decoding on the read data to obtain decoded data;
    performing error correction encoding on the decoded data to obtain re-encoded data; and
    writing the re-encoded data to a destination location.

21. The method of claim 18, wherein when it is determined that it is not okay to use the new read threshold for copy back, the selective copy back controller is further configured to:
    determine if a maximum number of new read thresholds has been tried without success;
    when it is determined that the maximum number of new read thresholds have been tried without success:
        read the source location to obtain read data;
        perform error correction decoding on the read data to obtain decoded data;
        perform error correction encoding on the decoded data to obtain re-encoded data; and
        write the re-encoded data to a destination location are performed; and
    when it is determined that the maximum number of new read thresholds have not been tried without success, obtain a second new read threshold.

22. The method of claim 12 further comprising:
    receiving a number of bit errors, a correctable/uncorrectable status, and a test set identifier associated with a test set of one or more read thresholds used to obtain the number of bit errors and the correctable/uncorrectable status;
    determining if a relevant record in a neighborhood table is empty;
    in the event it is determined that the relevant record is empty, storing the received number of bit errors, the received correctable/uncorrectable status, and the received test set identifier in the relevant record in the neighborhood table; and
    in the event it is determined that the relevant record is empty:
        determining if the received test set identifier is newer than a stored one;
        in the event it is determined that the received test set identifier is newer than the stored one, storing the received number of bit errors, the received correctable/uncorrectable status, and the received test set identifier in the relevant record in the neighborhood table; and
        in the event it is determined that the received test set identifier is not newer than the stored one:
            determining if the received number of bit errors or the received correctable/uncorrectable status is worse than the stored ones; and
            in the event it is determined that the received number of bit errors or the received correctable/uncorrectable status is worse than the stored ones, storing the received number of bit errors, the received correctable/uncorrectable status, and the received test set identifier in the relevant record in the neighborhood table.

23. A computer program product for moving data, the computer program product being embodied in a non-transitory computer readable storage medium and comprising computer instructions for:
    obtaining information associated with a neighborhood based at least in part on a source location;
    determining, based at least in part on the information associated with the determined neighborhood, whether to perform a copy back operation on the source location by:
        when it is determined the number of bit errors is less than the bit error threshold and the correctable/uncorrectable status is set to correctable, performing the copy back operation using a specified read threshold, and
        when it is determined the number of bit errors is greater than the bit error threshold or the correctable/uncorrectable status is set to uncorrectable, obtaining, with the processor, a new read threshold and performing the copy back operation using the new read threshold.

* * * * *